United States Patent
Nakagawa et al.

(10) Patent No.: US 9,696,156 B2
(45) Date of Patent: Jul. 4, 2017

(54) VIBRATING ELEMENT, SENSOR UNIT, ELECTRONIC APPARATUS, AND METHOD FOR MANUFACTURING VIBRATING ELEMENT

(71) Applicant: Seiko Epson Corporation, Tokyo (JP)

(72) Inventors: Keiji Nakagawa, Kamiina-gun (JP); Ryuta Nishizawa, Matsumoto (JP)

(73) Assignee: Seiko Epson Corporation (JP)

(*) Notice: Subject to any disclaimer, the term of this patent is extended or adjusted under 35 U.S.C. 154(b) by 359 days.

(21) Appl. No.: 13/847,644

(22) Filed: Mar. 20, 2013

(65) Prior Publication Data

US 2013/0255379 A1    Oct. 3, 2013

(30) Foreign Application Priority Data

Mar. 29, 2012  (JP) ................. 2012-076471

(51) Int. Cl.
| | |
|---|---|
| G01C 19/00 | (2013.01) |
| G01P 3/44 | (2006.01) |
| G01P 9/00 | (2012.01) |
| G01P 15/08 | (2006.01) |
| G01C 19/5607 | (2012.01) |
| G01C 19/5621 | (2012.01) |

(52) U.S. Cl.
CPC ..... *G01C 19/5607* (2013.01); *G01C 19/5621* (2013.01)

(58) Field of Classification Search
CPC ............ G01C 19/5607; G01C 19/5628
USPC ....................................... 73/504.16
See application file for complete search history.

(56) References Cited

U.S. PATENT DOCUMENTS

| | | | |
|---|---|---|---|
| 5,585,562 A * | 12/1996 | Kurata et al. | ............... 73/504.16 |
| 6,101,878 A | 8/2000 | Watarai | |
| 6,223,597 B1 | 5/2001 | Watarai | |
| 6,415,643 B2 | 7/2002 | Watarai | |
| 2001/0010169 A1 | 8/2001 | Watarai | |
| 2005/0225199 A1* | 10/2005 | Satoh et al. | .................. 310/312 |

FOREIGN PATENT DOCUMENTS

| | | | | |
|---|---|---|---|---|
| JP | 03-276013 A | 12/1991 | | |
| JP | 05256723 A | 10/1993 | | |
| JP | 11-072334 A | 3/1999 | | |
| JP | 11-351874 A | 12/1999 | | |
| JP | 2000-337880 A | 12/2000 | | |
| JP | 02004093158 A | * | 3/2004 | ............ G01C 19/56 |
| JP | 2004-286476 A | 10/2004 | | |
| JP | 2005-345404 A | 12/2005 | | |

(Continued)

OTHER PUBLICATIONS

Bilbliographic Data and Abstract in English of JP02004093158A, Date: Mar. 25, 2004, Publisher: JPO, p. 1.*

(Continued)

*Primary Examiner* — Lisa Caputo
*Assistant Examiner* — Roger Hernandez-Prewitt
(74) *Attorney, Agent, or Firm* — Harness, Dickey & Pierce, P.L.C.

(57) ABSTRACT

An vibrating gyro device includes a base, drive vibrating arms extending from one end of the base, and detection vibrating arms extending from the other end of the base that faces away from the one end, and an adjustment film is provided on each of the drive vibrating arms in an area close to the base.

14 Claims, 8 Drawing Sheets

(56) References Cited

FOREIGN PATENT DOCUMENTS

| | | |
|---|---|---|
| JP | 2007-256016 A | 10/2007 |
| JP | 2008-160824 A | 7/2008 |

OTHER PUBLICATIONS

English Translation of Detailed Description of JP02004093158A, Date: Mar. 25, 2004, Publisher: JPO and INPIT (National Center for Industrial Property Information and Training, pp. total: 5.*

* cited by examiner

VIBRATING ELEMENT, SENSOR UNIT, ELECTRONIC APPARATUS, AND METHOD FOR MANUFACTURING VIBRATING ELEMENT

BACKGROUND

1. Technical Field

The present invention relates to a vibrating element, a sensor unit, an electronic apparatus, and a method for manufacturing the vibrating element.

2. Related Art

A vibrating gyro sensor (hereinafter referred to as vibrating gyro) is widely used as an angular velocity sensor that enhances, for example, vehicle-related capabilities, such as vehicle body control and vehicle position detection that is performed by a car navigation system, and optical-apparatus-related capabilities, such as shaking control correction (what is called hand-shake correction) that is performed, for example, by a digital camera and a digital video camcorder. A vibrating gyro includes a gyro vibrating element made of quartz or any other piezoelectric single-crystal material as a highly elastic material, detects an angular velocity in the form of an electric signal produced in part of the gyro vibrating element by swing, rotation, and other vibrating actions of an object of interest, and calculates the angle of rotation to determine the displacement of the object.

As the vibrating element used in a gyro sensor, a piezoelectric vibrating element (vibrating gyro device) made of quartz or any other piezoelectric material has been widely used (see JP-A-5-256723, for example). The vibrating element described in JP-A-5-256723 is what is called a tuning-fork-type piezoelectric vibrating element including a base made of quartz and a pair of vibrating arms extending from one end of the base in parallel to each other. A drive electrode (vibration excitation electrode) is provided on a principal surface (first surface) of each of the vibrating arms, and the drive electrode supplies a drive voltage that causes the vibrating arm to vibrate. Further, a detection electrode is provided on a side surface perpendicular to the first surface of each of the vibrating arms. Each of the vibrating arms is allowed to vibrate when a drive signal (vibration excitation signal) is applied to the drive electrode. When a drive signal is applied to the vibrating element to cause the vibrating arms to vibrate in a direction along the first surface (in-plane vibration), and the vibrating element is rotated around a detection axis extending in the direction in which the vibrating arms extend (for example, Y axis in the case of vibrating gyro device formed of quartz Z plate), the vibrating arms vibrate under a Coriolis force in the direction perpendicular to the first surface (out-of-plane vibration). The amplitude of the out-of-plane vibration, which is proportional to the rotational speed of the vibrating element, can be detected in the form of an angular velocity.

To improve the detection sensitivity of the thus configured vibrating gyro device, it is important to adjust the resonant frequency of in-plane vibration produced by a drive signal (in-plane vibration frequency) and the resonant frequency of out-of-plane vibration based on which an angular velocity is detected (out-of-plane vibration frequency). The vibration frequency of a vibrating arm is typically adjusted by providing a metal film on the surface of a front end portion of the vibrating arm and irradiating the metal film with laser light to remove part of the metal film so that the frequency of bending vibration of the vibrating arm (resonant frequency) is adjusted (see JP-A-2008-160824, for example).

When the vibration frequency adjusting method described in JP-A-2008-160824 is applied to the vibrating gyro device described in JP-A-5-256723, however, the sensitivity improving adjustment cannot disadvantageously be made in an efficient manner. Specifically, when the frequency of in-plane vibration of each of the vibrating arms is adjusted by providing a metal film on the surface of a front end portion of the vibrating arm and irradiating the metal film with laser light to remove part of the metal film, the frequency of out-of-plane vibration (vibration produced under Coriolis force) is also changed at the same time, which does not allow the frequency of the out-of-plane vibration to agree with an intended value, disadvantageously resulting in a decrease in detection sensitivity of the vibrating gyro device.

SUMMARY

An advantage of some aspects of the invention is to solve at least a part of the problems described above, and the invention can be implemented as the following application examples or forms.

Application Example 1

This application example is directed to a vibrating element including a base and a drive vibrating arm and a detection vibrating arm extending from the base, and an adjustment film is provided on the drive vibrating arm in an area close to the base.

According to this application example, the vibrating element includes a base and a drive vibrating arm and a detection vibrating arm extending from the base, and an adjustment film is provided on the drive vibrating arm in an area close to the base. For example, in the case of a vibrating gyro including a tuning-fork-type vibrating element having a pair of drive vibrating arms and a pair of detection vibrating arms, it is important to adjust the resonant frequency of vibration produced in a predetermined plane by a drive signal (in-plane vibration frequency) and the resonant frequency of out-of-plane vibration (vibration oriented in direction that intersects predetermined plane) based on which an angular velocity is detected (out-of-plane vibration frequency). Specifically, to prevent the in-predetermined-plane resonant vibration of the vibrating arms that are driven from affecting the out-of-plane resonant vibration of the vibrating arms that detect an angular velocity (in the case of tuning-fork-type device, the vibrating arms that are driven also work as the vibrating arms that detects an angular velocity), the adjustment is, for example, so made in some cases that the resonant frequencies differ from each other. Since the vibrating element according to this application example includes an adjustment film provided on the drive vibrating arm in an area close to the base, adjusting stress that is produced by the adjustment film and affects the out-of-plane vibration of the drive vibrating arm allows adjustment of the out-of-plane vibration frequency without greatly affecting the in-plane vibration frequency. That is, adjustment of the detection sensitivity can be made and improvement in the detection sensitivity can be achieved without greatly affecting basic characteristics (drive frequency). As a result, in the case of a vibrating gyro, for example, a vibrating element having excellent detection sensitivity can be provided.

Application Example 2

This application example is directed to the vibrating element according to the application example described above, wherein the drive vibrating arm extends from one end of the base, and the detection vibrating arm extends from the other end of the base that faces away from the one end.

According to this application example, the vibrating element has the drive vibrating arm and the detection vibrating arm separately but continuously provided with the base therebetween. For example, in a vibrating gyro having the configuration in which the drive vibrating arm and the detection vibrating arm are formed separately from each other, to improve detection sensitivity, it is important to adjust the vibration frequencies of the drive and detection vibrating arms. Specifically, provided that the drive vibrating arm is making in-plane vibration, the detection sensitivity of the vibrating gyro depends on the efficiency at which out-of-plane vibration (vibration in direction that intersects in-plane vibration) produced in the drive vibrating arm when an angular velocity is applied thereto is transmitted to the detection vibrating arm connected to the base and causes the detection vibrating arm to make out-of-plane vibration. The transmission efficiency increases when the out-of-plane vibration of the drive vibrating arm and the out-of-plane vibration of the detection vibrating arm resonate with each other. Further, since the vibrating element includes an adjustment film provided on the drive vibrating arm in an area close to the base, adjusting stress that is produced by the adjustment film and affects the vibration of the drive vibrating arm allows adjustment of the out-of-plane vibration frequency of the drive vibrating arm without greatly affecting the in-plane vibration frequency of the drive vibrating arm. That is, since the adjustment of the in-plane vibration frequency of the drive vibrating arm and the adjustment of the out-of-plane vibration frequencies of the drive vibrating arm and the detection vibrating arm can be made separately from each other, the frequencies can be efficiently adjusted to intended values. As a result, in the case of a vibrating gyro, for example, a vibrating element having high detection sensitivity can be provided.

Application Example 3

This application example is directed to the vibrating element according to any of the application examples described above, wherein at least part of the adjustment film is removed.

According to this application example, the vibrating element includes an adjustment film provided on the drive vibrating arm in an area close to the base, and at least part of the adjustment film is removed. When the drive vibrating arm makes out-of-plane vibration, stress produced by the vibration tends to concentrate in a base-side area of the drive vibrating arm, that is, a base end portion of the drive vibrating arm. Adjusting the magnitude of stress produced by the adjustment film provided on the drive vibrating arm in an area close to the base therefore allows adjustment of the out-of-plane vibration frequency of the drive vibrating arm without greatly affecting the in-plane vibration frequency. Adjustment of stress means adjustment of elastic stress that the adjustment film produces in the drive vibrating arm and is specifically made by removing at least part of the adjustment film to adjust the thickness or volume thereof. The out-of-plane vibration frequency of the drive vibrating arm can be more efficiently adjusted to an intended value by making the adjustment describe above. As a result, in the case of a vibrating gyro, for example, a vibrating element having high detection sensitivity can be provided.

Application Example 4

This application example is directed to the vibrating element according to any of the application examples described above, wherein the drive vibrating arm is provided with a weight portion on the front end side thereof.

The vibrating element is preferably so configured that the drive vibrating arm is provided with a weight portion on the front end side thereof, as shown in this application example. The in-plane vibration frequency of the drive vibrating arm can be adjusted, for example, by forming a wide front end portion of the drive vibrating arm as a weight portion, providing a metal film on the surface of the front end portion, and irradiating the metal film with laser light or otherwise processing the metal film to remove part of the metal film so as to adjust the frequency of bending vibration of the drive vibrating arm. Providing the weight portion as described above can increase the range over which the in-plane vibration frequency is adjusted. Further, it is not necessary to increase the length of the drive vibrating arm for the frequency adjustment, whereby a compact vibrating element can be provided.

Application Example 5

This application example is directed to a sensor unit including the vibrating element according to any of the application examples described above and an electronic part including a drive circuit that causes the drive vibrating arm to vibrate and a detection circuit that detects a detection signal produced in the detection vibrating arm.

Since the sensor unit according to this application example includes a drive circuit that causes the drive vibrating arm to vibrate, a detection circuit that detects a detection signal produced in the detection vibrating arm, and a vibrating element efficiently adjusted to be capable of higher-sensitivity detection than in related art, the sensor unit can have stable characteristics.

Application Example 6

This application example is directed to an electronic apparatus including the vibrating element according to any of the application examples described above.

Since the electronic apparatus according to this application example includes a vibrating element efficiently adjusted to be capable of higher-sensitivity detection than in related art, the electronic apparatus can have stable characteristics.

Application Example 7

This application example is directed to a method for manufacturing a vibrating element including providing a vibrating body including a base and a drive vibrating arm and a detection vibrating arm extending from the base, increasing the mass of the drive vibrating arm on the front end side thereof or decreasing the mass of the drive vibrating arm on the front end side thereof, and forming an adjustment film on the drive vibrating arm in an area close to the base or forming an adjustment film on the drive vibrating arm in an area close to the base and removing at least part of the adjustment film.

According to the manufacturing method of this application example, the adjustment of the in-plane vibration frequency of the drive vibrating arm and the adjustment of the out-of-plane vibration frequencies of the drive vibrating arm and the detection vibrating arm can be made separately from each other, whereby the frequencies can be efficiently adjusted to intended values. As a result, in the case of a vibrating gyro, for example, a vibrating element having high detection sensitivity can be provided.

BRIEF DESCRIPTION OF THE DRAWINGS

The invention will be described with reference to the accompanying drawings, wherein like numbers reference like elements.

DESCRIPTION OF EXEMPLARY EMBODIMENTS

Embodiments in which the invention is implemented will be described below with reference to the drawings. The following description is made of embodiments of the invention but does not limit the invention. The following figures are not drawn to scale in some cases for ease of description.

First Embodiment

Vibrating Gyro Device

Figure 1:
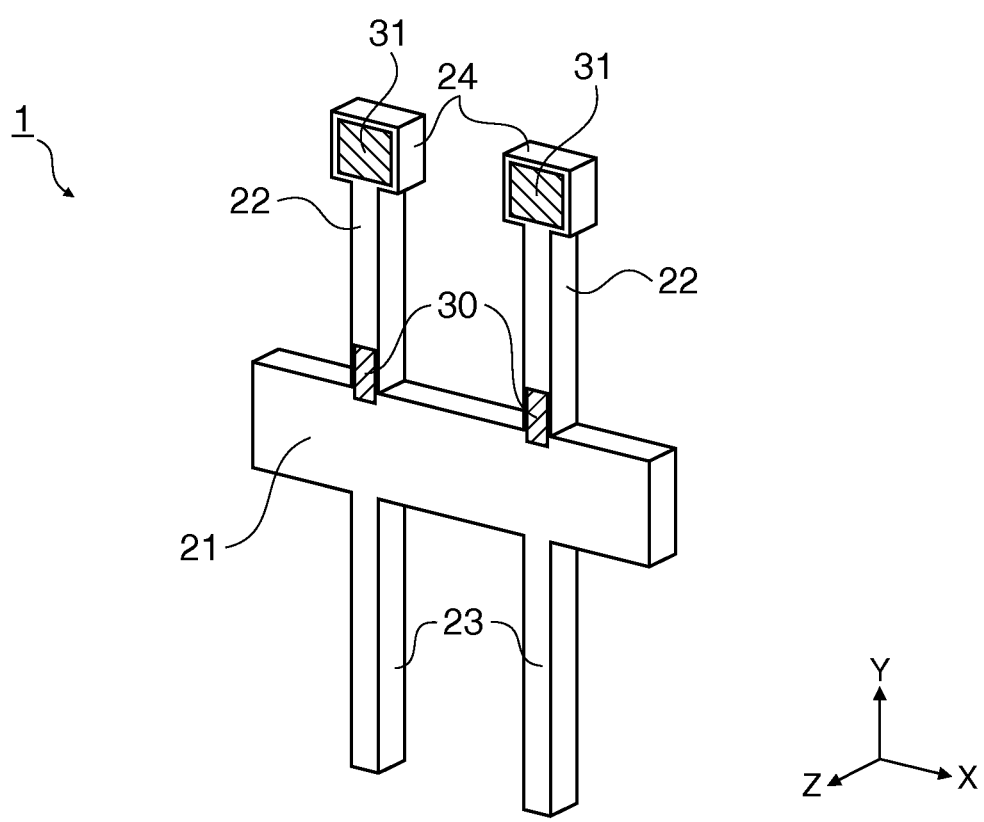
FIG. 1 is a schematic perspective view showing a vibrating gyro device in the form of a vibrating element according to a first embodiment.

A description will first be made of a vibrating element according to an embodiment of the invention implemented as a vibrating gyro device. FIG. 1 is a schematic perspective view showing a vibrating gyro device 1 in the form of a vibrating element according to a first embodiment.

The vibrating gyro device 1 is formed, for example, of a base 21, drive vibrating arms 22, detection vibrating arms 23, weight portions 24, adjustment films 30, and adjustment weights 31.

The base 21, the drive vibrating arms 22, the detection vibrating arms 23, and the weight portions 24 are formed as an integral piece by processing a base material (material of which key portion is made). The base material is, for example, quartz, which is a piezoelectric material. Quartz has an X axis called an electric axis, a Y axis called a mechanical axis, and a Z axis called an optical axis. This embodiment will be described with reference to a case where the base material is what is called a quartz Z plate produced by cutting a quartz block along a plane defined by the X and Y axes perpendicular to each other as quartz crystal axes and shaping the cut quartz into a flat plate having a predetermined thickness in the Z-axis direction perpendicular to the plane. The predetermined thickness used herein is set as appropriate in accordance with the vibration frequency (resonant frequency), the exterior size, the processability, and other factors of the vibrating gyro device.

When the flat plate that forms the vibrating gyro device 1 is cut from a quartz block, there is an inevitable error in cutting angle, and certain amounts of cutting angle errors with respect to the X, Y, and Z axes are acceptable. For example, a flat plate cut from a quartz block along a plane that deviates from the X axis by 0 to 2 degrees is usable. The same holds true for the Y and Z axes.

The components of the vibrating gyro device 1 are configured as follows. The base 21 is positioned at the center of the vibrating gyro device 1 and has a substantially rectangular shape; the pair of drive vibrating arms 22 extend from one of the Y-axis-side ends of the base 21 (+Y-axis-side end in FIG. 1) along the Y axis in parallel to each other; and the pair of detection vibrating arms 23 extend from the other Y-axis-side end of the base 21 (−Y-axis-side end in FIG. 1) along the Y axis in parallel to each other. The vibrating gyro device 1, which is so shaped that the corresponding vibrating arms of the pair of drive vibrating arms 22 and the pair of detection vibrating arms 23 extend from the opposite ends of the base 21 in the coaxial direction, is called an H-type vibrating element (H-type vibrating gyro device) in some cases. The H-type vibrating gyro device 1, in which the corresponding vibrating arms of the drive vibrating arms 22 and the detection vibrating arms 23 extend from the opposite ends of the base 21 that lie on the same axial direction, has a drive system and a detection system separated from each other, whereby the amount of electrostatic coupling between electrodes or wiring lines of the drive system and those of the detection system is reduced and hence stable detection sensitivity is achieved.

The center of the base 21 can be the center of gravity as a gravitationally central position of the vibrating gyro device 1. It is assumed that the X axis, the Y axis, and the Z axis are perpendicular to each other and pass through the center of gravity. The exterior shape of the vibrating gyro device 1 can be symmetrical with respect to a virtual central line passing through the center of gravity and extending in the Y-axis direction. The thus formed vibrating gyro device 1 has a well-balanced exterior shape and stable characteristics, whereby the detection sensitivity is preferably improved.

The exterior shape of the vibrating gyro device 1 described above can be formed in an etching process (wet or dry etching process) using a photolithography technology. It is noted that a plurality of vibrating gyro devices 1 can be formed from a single quartz wafer.

The weight portion 24 is attached to each of the drive vibrating arms 22 on the front end side thereof in the +Y-axis direction and has a substantially rectangular shape having a width greater than that of an elongated arm portion of the drive vibrating arm (wider in X-axis direction). Each of the adjustment weights 31 is provided on the surface of the corresponding weight portion 24. Each of the adjustment weights 31 is a film member and preferably made of a metal material.

The adjustment weights 31 are not necessarily made of a metal material but may alternatively be made of a non-conductive material. Using a non-conductive material is advantageous in that there is a wider range of material selection, and it is preferable to use a material having a greatest possible density (specific gravity). Although not shown, the adjustment weight 31 can be provided on the two principal surfaces and the two side surfaces of each of the weight portions 24.

The front end side of each of the drive vibrating arms 22 means an area starting from the position where the drive vibrating arm 22 is halved in the elongated direction and extending toward the front end (in +Y direction), and a base side (side where base 21 is present) of each of the drive vibrating arms 22 means an area starting from the position where the drive vibrating arm 22 is halved in the elongated direction and extending toward the base end (in −Y direction). The principal surfaces mean the front and rear surfaces parallel to an XY plane of the base material that forms the vibrating gyro device 1.

Each of the adjustment films 30 is a film member and made of a metal material, such as nickel as a preferable example. The adjustment film 30 is provided on a principal surface of each of the drive vibrating arms 22 in an area close to the base 21, as shown in FIG. 1.

When the drive vibrating arms 22 make out-of-plane vibration, stress produced by the vibration tends to concentrate in a base end portion of each of the drive vibrating arms 22, that is, an area of each of the drive vibrating arms close to the base 21. The frequency of out-of-plane vibration of each of the drive vibrating arms 22 can therefore be adjusted by adjusting the magnitude of stress produced by the adjustment film 30 provided on the drive vibrating arm 22 in an area close to the base 21. Adjustment of stress means adjustment of elastic stress that the adjustment film 30 produces in the drive vibrating arm 22 and is specifically made by increasing or decreasing the thickness or volume of the adjustment film 30.

The adjustment film 30 is not necessarily made of a metal material and may alternatively be made of a non-conductive material. Using a non-conductive material is advantageous in that there is a wider range of material selection, and it is preferable to use a material having a greatest possible elastic modulus. Although not shown, the adjustment film 30 can also be provided on the two principal surfaces and the two side surfaces of each of the drive vibrating arms 22.

Drive-system electrodes are provided on each of the drive vibrating arms 22, and detection-system electrodes are provided on each of the detection vibrating arms 23. The electrodes are, however, omitted in the drawings because the electrodes are connected in the same manner as in a vibrating gyro device of related art.

Angular velocity detection operation performed by the vibrating gyro device 1 will next be described.

Figure 2:
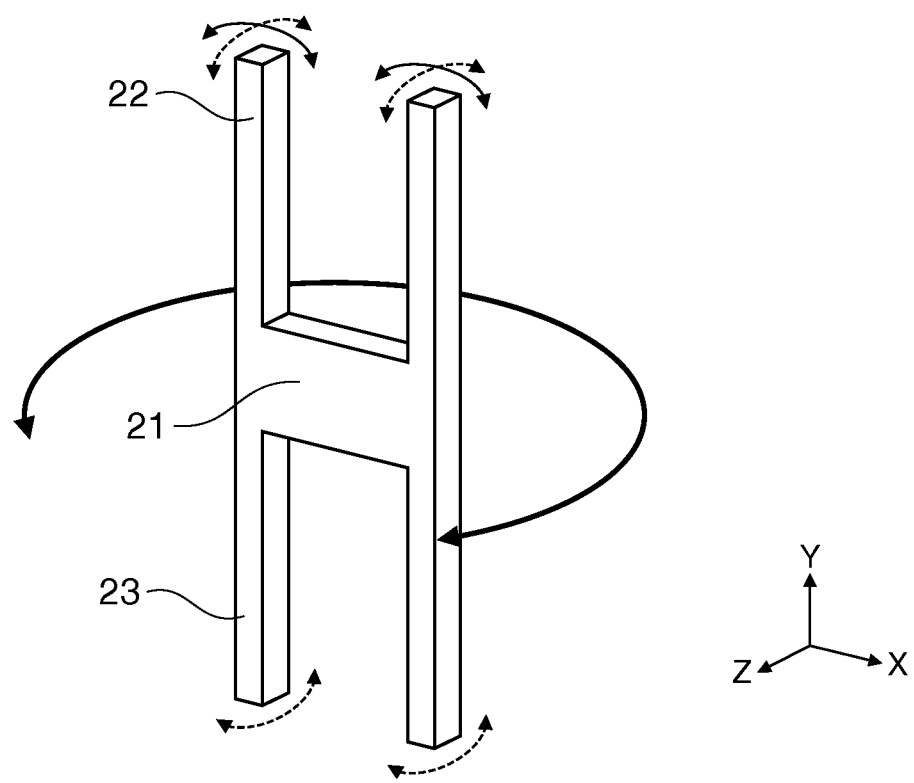
FIG. 2 is a schematic perspective view showing detection operation performed by the vibrating gyro device.

FIG. 2 is a schematic perspective view showing the detection operation performed by the vibrating gyro device. The components other than the base 21, the drive vibrating arms 22, and the detection vibrating arms 23 are omitted to simplify the description.

In the vibrating gyro device 1 having the configuration described above, an AC voltage having a frequency that agrees with the resonant frequency of the drive vibrating arms 22 in the X-axis direction is applied to the drive vibrating arms 22 through the drive-system electrodes. The pair of drive vibrating arms 22 then start making tuning-fork vibration in an XY plane (in-plane vibration indicated by solid-line arrows in FIG. 2).

In this state, when an angular velocity acts on the vibrating gyro device 1 around the Y axis, the drive vibrating arms 22 and the detection vibrating arms 23, which resonate with the drive vibrating arms 22, make out-of-plane vibration in the Z-axis direction (vibration indicated by broken-line arrows in FIG. 2) under a Coriolis force. The amplitude of the out-of-plane vibration, which is proportional to the rotational speed of the vibrating gyro device 1, can be detected in the form of an angular velocity by the detection-system electrodes.

In the case of a vibrating gyro having the configuration in which the drive vibrating arms and the detection vibrating arms are separately formed, to increase the detection sensitivity, it is important to adjust the vibration frequencies of the two types of vibrating arm. Specifically, to maintain the detection sensitivity of the vibrating gyro, it is required to maintain a fixed vibration frequency difference between the frequency of in-plane vibration and the frequency of out-of-plane vibration of the drive vibrating arms 22.

In actual manufacturing processes, etching anisotropy of quartz, of which the vibrating gyro device 1 is made, and variations in the manufacturing processes result in not only an undesired cross-sectional shape of each of the drive vibrating arms 22 and the detection vibrating arms 23, which may cause a leakage output, but also variations in the length and width of each of the drive vibrating arms 22 and the detection vibrating arms 23, which cause shift in resonant frequency that lowers the detection sensitivity. To improve the detection sensitivity, it is therefore necessary to make post-manufacture frequency adjustment.

Resonant frequency adjustment in this embodiment will next be descried.

Figure 3A:
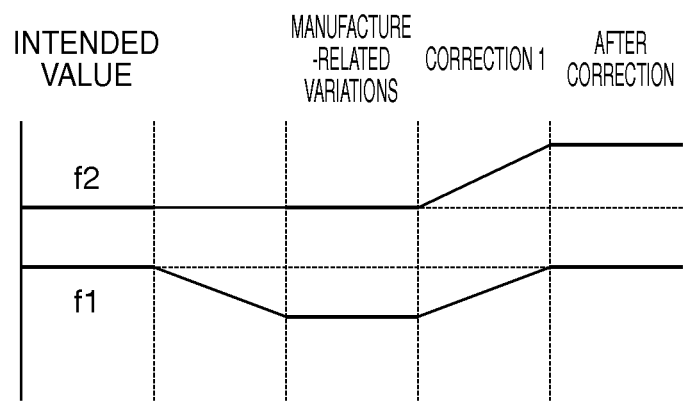
FIGS. 3A and 3B are graphs for describing examples of frequency adjustment.
Figure 3B:
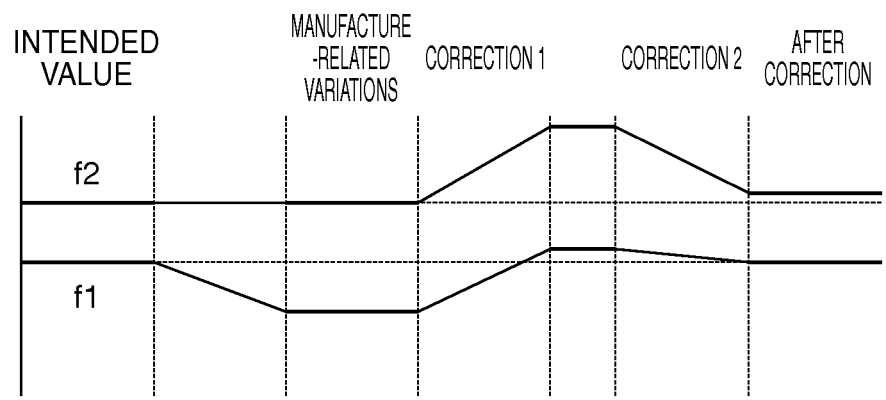

FIGS. 3A and 3B are graphs for describing examples of the frequency adjustment.

To reduce variations in the detection sensitivity and detection precision and make them stable, the difference between the frequency of in-plane vibration of the drive vibrating arms 22 (hereinafter referred to as drive mode frequency: f1) and the frequency of out-of-plane vibration thereof (hereinafter referred to as detection mode frequency: f2) needs to agree with a predetermined value.

In the manufacturing stage, intended vibration frequency and natural frequency are not always achieved due to process-related variations and other factors. As an example in which the width of each of the vibrating arms is narrower than an intended width, FIG. 3A shows that f1 is lower than an intended value, whereas f2 changes very little.

In related art, the mass of a front end portion of each of the drive vibrating arms 22 is then so adjusted that the two types of vibration frequency agree with intended values. Specifically, the frequency of in-plane vibration of each of the drive vibrating arms 22 is adjusted by adding the adjustment weight 31 to the weight portion 24 (FIG. 1) or irradiating the adjustment weight 31 with laser light or otherwise processing the adjustment weight 31 to remove part thereof.

FIG. 3A shows that the adjustment described above (correction 1) can correct f1 and it agrees with an intended value. When the mass of a front end portion of each of the drive vibrating arms 22 is adjusted by using the method described above, the drive mode frequency (f1) can be adjusted to an intended value, but the detection mode frequency (f2) also changes at the same time, resulting in a shift of the detection mode frequency (f2) of the drive vibrating arm 22 from an intended value.

In contrast, in this embodiment, the frequency of out-of-plane vibration of each of the drive vibrating arms 22 is further adjusted by adjusting the stress produced by the adjustment film 30 (FIG. 1) provided on the drive vibrating arm 22 in an area close to the base 21. FIG. 3B shows the adjustment described above.

The adjustment of the stress produced by the adjustment films 30 is effective in adjusting the detection mode frequency f2 of the drive vibrating arm 22 but affects the drive mode frequency (f1) of the drive vibrating arm 22 at the same time to no small extent. The degree of the adverse effect of the adjustment described above is, however, smaller than the effect of the adjustment based on the weight portion 24. The frequencies f1 and f2 can therefore be adjusted separately from each other.

Specifically, the correction 1 is made in a temporarily excessive manner in consideration of an effect of the correction 1 on f2. FIG. 3B shows that f1 and f2 are corrected by adjusting the mass of the adjustment weight 31 (correction 1). The stress produced by the adjustment film is then adjusted. Specifically, the detection mode frequency (f2) of the drive vibrating arm is adjusted by adding the adjustment film 30 or irradiating the adjustment film 30 with laser light or otherwise processing the adjustment film 30 to remove part thereof so that the stress that the adjustment film 30 produces in the drive vibrating arms 22 is changed.

FIG. 3B shows that the correction described above (correction 2) can reduce the discrepancy from an intended value as compared with the case shown in FIG. 3A and hence both f1 and f2 agree with respective intended values.

As described above, the vibrating gyro device 1 in the form of a vibrating element according to this embodiment can provide the following advantageous effects.

Adjusting the stress produced by the adjustment film 30 provided on each of the drive vibrating arms 22 in an area close to the base 21 allows adjustment of the detection mode frequency (f2) of the drive vibrating arms 22 without greatly affecting the drive mode frequency (f1).

Therefore, in the detection sensitivity adjustment, the adjustment of the drive mode frequency (f1) of each of the drive vibrating arms 22 and the adjustment of the detection mode frequency (f2) of the drive vibrating arm 22 can be made separately from each other, whereby the two types of frequency can be efficiently adjusted to respective intended values. As a result, in the case of a vibrating gyro, for example, a vibrating element having high detection sensitivity can be provided.

Second Embodiment

Vibrating Gyro Device

Figure 4:
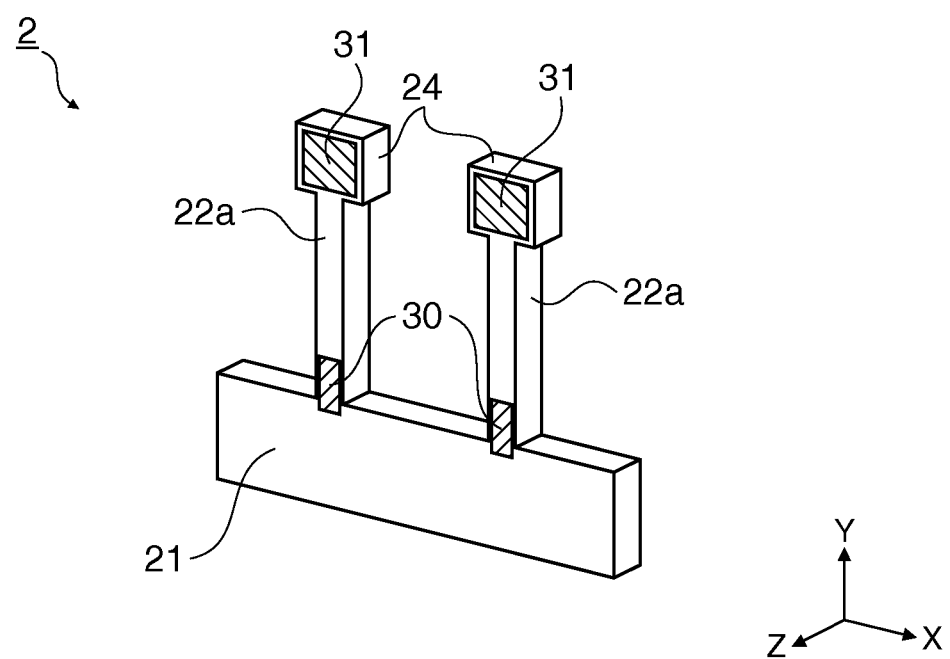
FIG. 4 is a schematic perspective view showing a vibrating gyro device in the form of a vibrating element according to a second embodiment.

FIG. 4 is a schematic perspective view showing a vibrating gyro device 2 in the form of a vibrating element according to a second embodiment.

The vibrating gyro device 2 is a tuning-fork-type vibrating element and formed, for example, of a base 21, vibrating arms 22a, weight portions 24, adjustment films 30, and adjustment weights 31. The base 21, the vibrating arms 22a, and the weight portions 24 are formed as an integral piece by processing a base material.

The vibrating gyro device 2 includes a pair of vibrating arms 22a instead of the pair of drive vibrating arms 22 and the pair of detection vibrating arms 23. Further, both the drive-system electrodes provided on the drive vibrating arms 22 and the detection-system electrodes provided on the detection vibrating arms 23 are provided on the vibrating arms 22a. In other words, the vibrating arms 22a have a configuration in which the drive vibrating arms 22 are further provided with the detection-system electrodes. That is, the vibrating arms 22a have not only the function of the drive vibrating arms but also the function of the detection vibrating arms. The vibrating gyro device 2 is the same as the vibrating gyro device 1 except the differences described above.

The drive-system electrodes and the detection-system electrodes are connected in the same manner as in a tuning-fork-type vibrating gyro device of related art.

In the vibrating gyro device 2 having the configuration described above, an AC voltage having a frequency that agrees with the resonant frequency of the vibrating arms 22a in the X-axis is applied to the vibrating arms 22a through the drive-system electrodes. The pair of vibrating arms 22a then start making tuning-fork vibration in an XY plane.

In this state, when an angular velocity acts on the vibrating gyro device 2 around the Y axis, the vibrating arms 22a make out-of-plane vibration in the Z-axis direction under a Coriolis force. The amplitude of the out-of-plane vibration, which is proportional to the rotational speed of the vibrating gyro device 2, can be detected in the form of an angular velocity by the detection-system electrodes.

Also in the tuning-fork-type vibrating gyro device 2, the difference between the frequency of in-plane vibration produced by a drive signal and the frequency of out-of-plane vibration based on which an angular velocity is detected affects the sensitivity. It is therefore important to adjust the frequency difference described above.

When the vibrating arms 22a make out-of-plane vibration, stress produced by the vibration tends to concentrate in a base end portion of each of the vibrating arms 22a, that is, an area of each of the vibrating arms 22a close to the base 21. The frequency of out-of-plane vibration of each of the vibrating arms 22a can therefore be adjusted by adjusting the magnitude of stress produced by the adjustment film 30 provided on the vibrating arm 22a in an area close to the base 21.

In the resonant frequency adjustment in this embodiment, the mass of a front end portion of each of the vibrating arms 22a is first so adjusted that the two types of vibration frequency agree with intended values. Specifically, the frequency of in-plane vibration of each of the vibrating arms 22a is adjusted by adding the adjustment weight 31 to the weight portion 24 (FIG. 4) or irradiating the adjustment weight 31 with laser light or otherwise processing the adjustment weight 31 to remove part thereof.

The frequency of out-of-plane vibration of the vibrating arm 22a is then adjusted by adjusting the stress produced by the adjustment film 30 (FIG. 4) provided on the vibrating arm 22a in an area close to the base 21.

The adjustment of the stress produced by the adjustment film 30 is effective in adjusting the frequency of out-of-plane vibration of the vibrating arm 22a but affects the frequency of in-plane vibration of the vibrating arm 22a at the same time to no small extent. The degree of the adverse effect of the adjustment described above is, however, smaller than the effect of the adjustment based on the weight portion 24. The two types of frequency can therefore be adjusted separately from each other.

As described above, also in the vibrating gyro device 2 in the form of a tuning-fork-type vibrating element according to this embodiment, adjusting the stress produced by the adjustment film 30 provided on each of the vibrating arms 22a in an area close to the base 21 allows adjustment of the frequency of out-of-plane vibration without greatly affecting the frequency of in-plane vibration. That is, adjustment of the detection sensitivity can be made and improvement in the detection sensitivity can be achieved without greatly affecting basic characteristics (drive frequency). As a result, a vibrating element having excellent detection sensitivity can be provided.

Third Embodiment

Gyro Sensor

A gyro sensor 50 as a sensor unit according to a third embodiment will next be described. In the description, the same components as those in the embodiments described above have the same reference characters and no redundant description of the same components will be made.

Figure 5A:
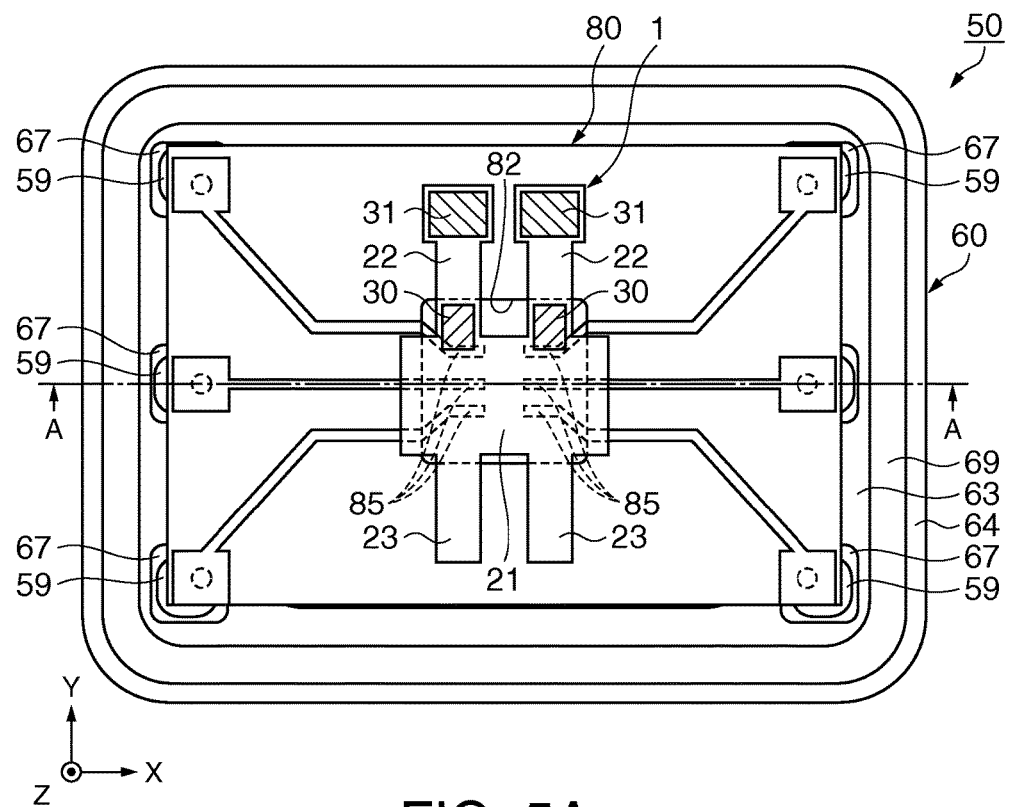
FIG. 5A is a schematic plan view of a gyro sensor in which the vibrating gyro device is incorporated.
Figure 5B:
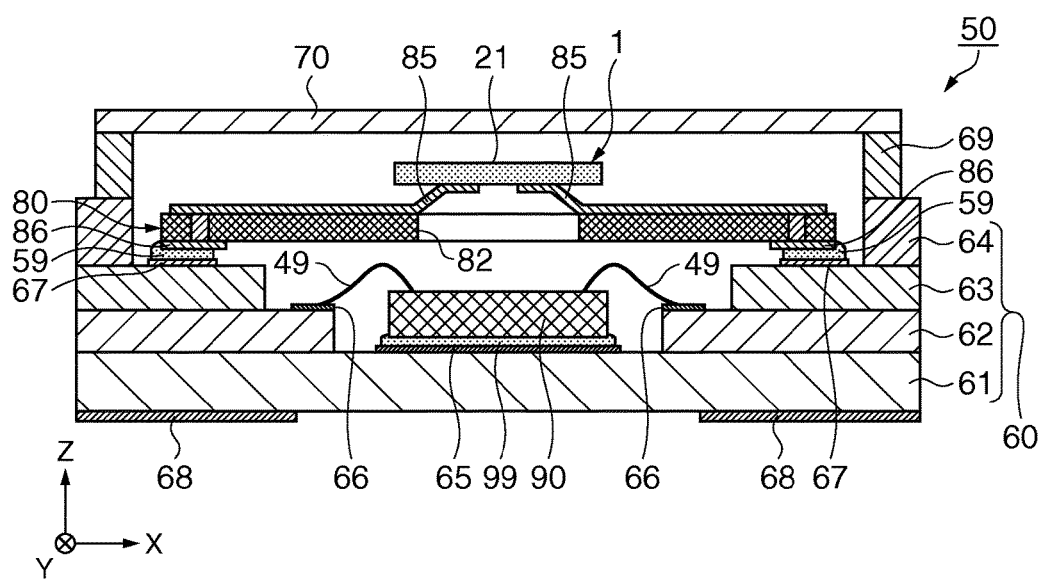
FIG. 5B is a cross-sectional view of the gyro sensor taken along the line A-A in FIG. 5A.

FIGS. 5A and 5B describe the gyro sensor 50. FIG. 5A is a schematic plan view of the gyro sensor 50 viewed from above, and FIG. 5B is a schematic cross-sectional view of the gyro sensor 50 taken along the line A-A in FIG. 5A.

FIG. 5A shows a state in which a lid 70 as a lid member that is an upper portion of the gyro sensor 50 is removed for ease of description of the inner structure of the gyro sensor 50. The configuration of the gyro sensor 50 according to this embodiment will be described with reference to a case where the vibrating gyro device 1 according to the first embodiment is incorporated as a vibrating element.

The gyro sensor 50 includes a package 60 having a recess, the lid 70 as a lid member that closes an opening of the package 60, the vibrating gyro device 1 bonded into the package 60 via a relay substrate 80, and an IC chip 90 as an electronic part, as shown in FIGS. 5A and 5B.

The recess of the package 60 has steps and protrusions and is formed, for example, by first placing a first layer substrate 61 having a flat plate shape and then stacking a second layer substrate 62, a third layer substrate 63, and a fourth layer substrate 64 having rectangular frame shapes and openings having different sizes in this order on the first layer substrate 61. The thus formed recess can accommodate the vibrating gyro device 1 and the IC chip 90. The package 60 can be made, for example, of a ceramic or glass material.

A die pad 65, on which the IC chip 90 is disposed, is provided on the first layer substrate 61, which forms a recess bottom portion of the recess of the package 60. Exterior mounting terminals 68, which can be bonded to an external substrate, are provided on the surface of the first layer substrate 61 that differs from the surface on which the die pad 65 is provided and forms an outer bottom surface of the package 60.

A plurality of IC connection terminals 66, which are bonded to a plurality of corresponding electrode pads (not shown) provided on an active surface of the IC chip 90 (upper surface in FIG. 5B), are provided on the step so formed by the second layer substrate 62 that the step surrounds the die pad 65 in the recess of the package 60.

Further, above the second layer substrate 62 on which the plurality of IC connection terminals 66 are provided, vibrating element connection terminals 67, which are bonded to the vibrating gyro device 1 via the relay substrate 80, are provided on the step so formed by the third layer substrate 63 that the step surrounds the IC connection terminals 66.

Each of the variety of terminals described above provided in the package 60 is connected to the corresponding terminal with a routed wiring line, a through hole, or any other intralayer wiring line (not shown).

The IC chip 90 includes a drive circuit as an vibration excitation unit that drives and causes the vibrating gyro device 1 to vibrate and a detection circuit as a detection unit that detects detectable vibration produced in the vibrating gyro device 1 when an angular velocity is applied thereto. Specifically, the drive circuit provided in the IC chip 90 supplies a drive signal to each of the drive electrodes (not shown) formed on the pair of drive vibrating arms 22 of the vibrating gyro device 1. The detection circuit provided in the IC chip 90 amplifies a detection signal produced in each of the detection electrodes (not shown) formed on the pair of detection vibrating arms 23 of the vibrating gyro device 1 to produce an amplified signal and detects a rotational angular velocity applied to the gyro sensor 50 based on the amplified signal.

The IC chip 90 is glued and fixed onto the die pad 65 provided on the recess bottom portion of the recess of the package 60 with a die attaching material 99 (wax material, for example). In this embodiment, the IC chip 90 is electrically connected to the package 60 in a wire bonding process. That is, the plurality of electrode pads provided on the IC chip 90 are connected to the corresponding IC connection terminals 66 in the package 60 with bonding wires 49.

The vibrating gyro device 1 is bonded to the relay substrate 80, which is located above the IC chip 90, in the recess of the package 60.

The relay substrate 80 is a wiring substrate that not only supports the vibrating gyro device 1 elastically to a predetermined extent without formation of any complicated support structure for supporting the vibrating gyro device 1 in the recess of the package 60 but also relays electric connection between the vibrating gyro device 1 and the package 60. The relay substrate 80 in this embodiment includes an insulating substrate having an opening (device hole) 82 provided in an area facing the base 21, where a support of the vibrating gyro device 1 is formed, a plurality of electrode lead wires 85 provided on one principal surface of the substrate, and connection electrodes 86 electrically connected to the corresponding electrode lead wires 85, for example, with intralayer wiring lines in the substrate. Each of the plurality of electrode lead wires 85 has one end disposed on the substrate and the other end extending toward the center of the opening 82 of the substrate and overhung above the opening 82.

The portion of each of the electrode lead wires 85 that is overhung above the opening 82 is formed by bending the electrode lead wire obliquely upward (toward lid 70) once at a point somewhere middle of the electrode lead wire extending from the substrate toward the center of the opening 82 and then bending the electrode lead wire again horizontally toward the center of the opening 82. The other end (front end) of each of the electrode lead wires 85 is disposed in a position of an corresponding exterior connection terminal (not shown) provided on the base 21 of the vibrating gyro device 1 so that the electrode lead wire 85 is electrically connected and mechanically bonded to the vibrating gyro device 1.

The relay substrate 80 can, for example, be a TAB (tape automated bonding) substrate for TAB mounting known in related art. Using a TAB substrate formed of a hoop-shaped insulating substrate on which a large number of relay substrates 80 are formed at equal intervals allows a series of steps from the step of manufacturing the relay substrates 80 to the step of mounting the vibrating gyro device 1 to be carried out continuously and efficiently.

It is noted that the relay substrate 80 is not limited to the TAB substrate described in this embodiment but can, for example, be formed of a lead frame.

The vibrating gyro device 1 can be bonded to the relay substrates 80 as follows: A bonding metal layer made, for example, of tin (Sn) or gold (Au) is formed in advance around each of the electrode lead wires 85 in a plating process or any other suitable process; a bonding metal layer is formed also on each of the exterior connection electrodes (not shown) provided on the base 21 of the vibrating gyro device 1; and each of the electrode lead wires 85 is positioned at the corresponding exterior connection electrode and bonded thereto by heating and pressurizing them in a metal eutectoid or metal bonding process. Other bonding methods using metal bumps, a conductive adhesive, and other bonding members (flip chip bonding) can be used.

The vibrating gyro device 1 bonded to the plurality of electrode lead wires 85 extending and overhung above the opening 82 of the relay substrates 80 is flexibly supported by the elastic electrode lead wires 85 having undergone a forming process. Therefore, when an impact acts on the gyro sensor 50, for example, when it is dropped, the electrode lead wires 85 absorb the impact and prevent the vibrating gyro device 1 from being damaged or otherwise defective, whereby the impact resistance of the gyro sensor 50 is advantageously improved.

The relay substrate 80 to which the vibrating gyro device 1 is bonded is bonded at a level above the IC chip 90 in the recess of the package 60. Specifically, the connection electrodes 86, which are not only provided on the surface of the relay substrate 80 different from the surface to which the vibrating gyro device 1 is bonded but also electrically connected to the plurality of electrode lead wires 85 of the relay substrates 80 that are connected to the vibrating gyro device 1, are positioned at the vibrating element connection terminals 67 provided on the step formed by the third layer substrate 63 of the package 60, and the connection electrodes 86 are bonded and fixed to the vibrating element connection terminals 67 with a bonding material 59, such as a conductive adhesive, for electrical connection.

This embodiment has been described with reference to the aspect in which the vibrating gyro device 1 is bonded into the package 60 via the relay substrate 80, but the relay substrate 80 is not necessarily used and any support structure that prevents vibration of the vibrating gyro device 1 from leaking or otherwise undetected may be used. For example, a support structure in which a support having connection terminals is provided and the vibrating gyro device 1 is bonded to and supported by the support may be formed in the recess of the package 60.

The lid 70 is disposed as a lid member on the package 60 into which the IC chip 90 and the vibrating gyro device 1 are bonded so that the lid 70 seals the opening of the package 60. The lid 70 can be made, for example, of a 42 alloy (iron alloy containing 42% of nickel), a kovar alloy (alloy of iron, nickel, and cobalt), or any other suitable metal, a ceramic material, or a glass material. For example, a lid 70 made of a metal is bonded in a seam welding process to the package 60 via a seal ring 69 made of a kovar alloy or any other suitable alloy and formed into a rectangular frame-like shape in a die drawing process. The recessed space formed by the package 60 and the lid 70 allows the vibrating gyro device 1 to operate.

The recessed space can be sealed and encapsulated to form a reduced pressure space or an inert gas atmosphere (details will be described later).

The sensor unit according to this embodiment, which includes the drive circuit that causes the drive vibrating arms 22 to vibrate, the detection circuit that detects a detection signal produced in the detection vibrating arms 23, and the vibrating element efficiently adjusted to be capable of higher-sensitive detection than in related art, can provide a sensor unit having stable characteristics.

Fourth Embodiment

Method for Manufacturing Gyro Device and Gyro Sensor

A description will next be made of a method for manufacturing the vibrating gyro device 1 and the gyro sensor 50 with reference to an embodiment of a method for manufacturing the gyro sensor 50 as a sensor unit according to the third embodiment described above. In the description, the same components as those in the embodiments described above have the same reference characters and no redundant description of the same components will be made.

Figure 6:
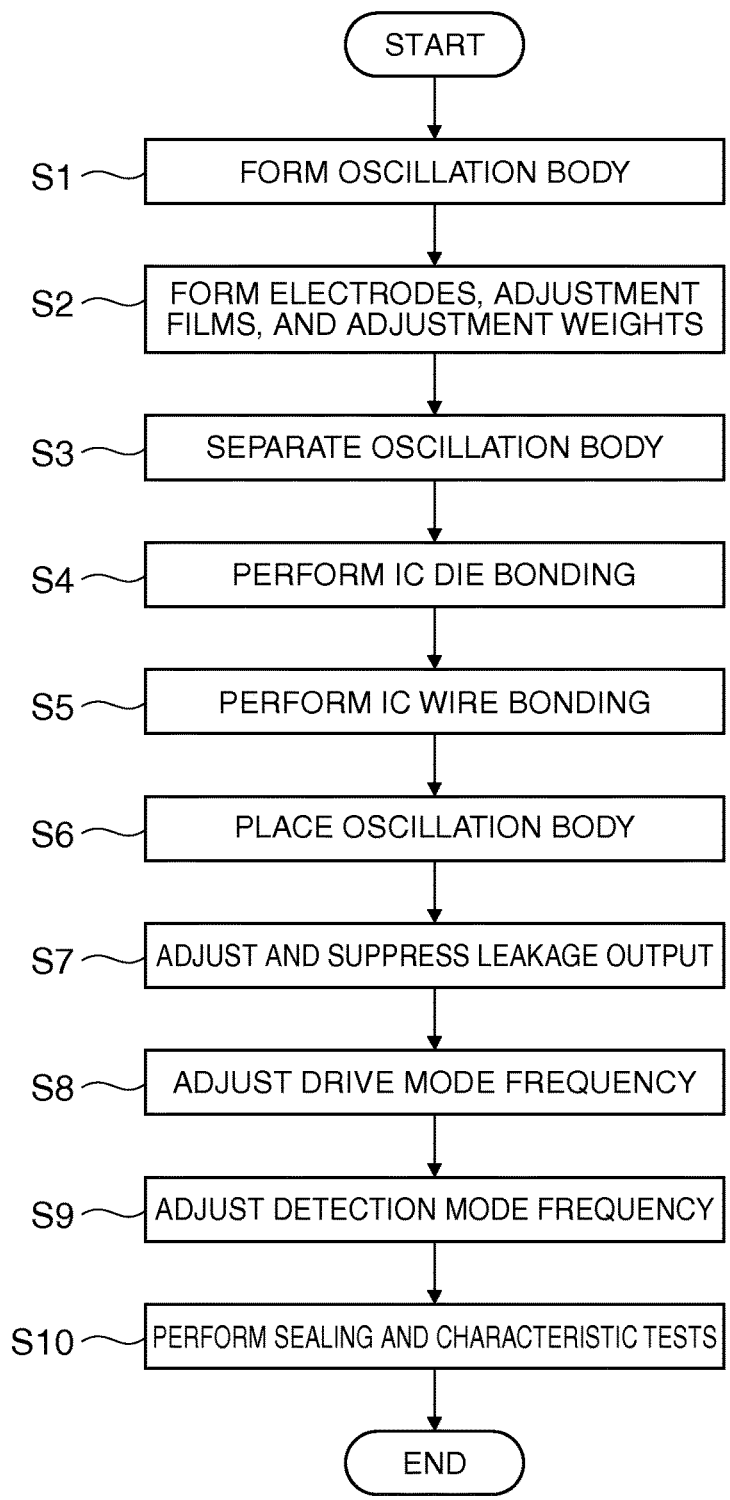
FIG. 6 is a flowchart showing a method for manufacturing the gyro sensor.

FIG. 6 is a flowchart for describing an example of a method for manufacturing the gyro sensor as a sensor unit.

First, a vibrating body that forms the vibrating gyro device 1 is provided.

Specifically, a vibrating body formed of the base 21, the drive vibrating arms 22, the detection vibrating arms 23, the weight portions 24, and other components in the form of an integral piece is formed from a base material in an etching process using a photolithography technology, as shown in step S1. The base material is quartz, which is a preferable example of a piezoelectric material. A quartz wafer is used as a substrate material, and a plurality of vibrating bodies are formed from a single wafer. At this point, part of a vibrating body is connected to part of another vibrating body and the vibrating bodies maintain the form of the single wafer.

The electrodes, the adjustment films 30, and the adjustment weights 31 are then formed on each of the vibrating bodies, as shown in step S2. The electrodes are formed by depositing a metal material, for example, in a vapor deposition process. When the adjustment films 30 and the adjustment weights 31 are made of the same material as that of the electrodes, it is preferable to form the adjustment films 30 and the adjustment weights 31 at this point. When the adjustment films 30 or the adjustment weights 31 are made of a material different from the material of the electrode, the adjustment films 30 or the adjustment weights 31 are formed by using a method appropriate for the type of the material. In this case, the adjustment films 30 or the adjustment weights 31 are formed after or before the electrodes are formed.

The vibrating bodies connected to each other are then separated into individual vibrating bodies, as shown in step S3. The vibrating body that forms the vibrating gyro device 1 is thus provided. It is noted that the vibrating body provided at this point is the vibrating gyro device 1 before vibration leakage adjustment and frequency adjustment are made. The vibrating gyro device 1 in the form of a vibrating element is completed after the adjustments, which will be described later, are made.

The package 60 and the IC chip 90 are then provided and assembled to form the gyro sensor 50.

The IC chip 90 is first bonded onto the die pad 65, which is provided on the recess bottom portion of the recess of the package 60, in a die bonding process, as shown in step S4. Specifically, the die attaching material 99 is applied onto the die pad 65 by an appropriate amount, and the IC chip 90 is then positioned and placed on (temporally fixed to) the die pad 65. The resultant structure is then heated at a predetermined temperature for a predetermined period so that the die attaching material 99 solidifies. The IC chip 90 is thus glued and fixed to the die pad 65.

The IC chip 90 and the package 60 are then electrically connected to each other in a wire bonding process, as shown in step S5.

The connection between the IC chip 90 and the package 60 are made by connecting the plurality of IC connection terminals 66, which are disposed on the second layer substrate 62 of the package 60, to the corresponding electrode pads (not shown) on the IC chip 90 with the bonding wires 49, as shown in FIGS. 5A and 5B.

The vibrating body provided in step S3 is then incorporated in the recess of the package 60 and placed at a level above the IC chip 90, as shown in step S6. For example, the vibrating gyro device 1 can be bonded to the package 60 via the relay substrate 80, as described above in the third embodiment. In this case, the vibrating body is first boned to the relay substrate 80. The vibrating body can be specifically bonded to the relay substrate 80 by forming a bonding metal layer made, for example, of tin or gold in advance around each of the electrode lead wires 85 in a plating process or any other suitable process, forming a bonding metal layer also on each of the exterior connection electrodes (not shown) provided on the base 21 of the vibrating body, positioning each of the electrode lead wires 85 at the corresponding exterior connection electrode, and heating and pressurizing the electrode lead wires 85 and the exterior connection electrodes in a metal eutectoid or metal bonding process. The connection electrodes 86, which are provided on the surface of the relay substrate 80 different from the surface to which the vibrating body is boned and are electrically connected to the plurality of electrode lead wires 85 connected to the vibrating body bonded on the relay substrate 80, are positioned at the vibrating element connection terminals 67 provided on the step formed by the third layer substrate 63 of the package 60 and temporarily fixed to the vibrating element connection terminals 67 with the bonding material 59, such as a conductive adhesive. The bonding material 59 is then allowed to solidify so that the relay substrate 80 to which the vibrating body is boned is bonded and fixed into the package 60 for electrical connection. When the bonding material 59 is of thermosetting type, the bonding material 59 is allowed to solidify by heating it at a predetermined temperature for a predetermined period.

When the bonding material 59 is, for example, of UV curable type, the relay substrate 80 to which the vibrating body is bonded can be glued and fixed by irradiating the bonding material 59 with ultraviolet light having a predetermined intensity for a predetermined period so that the bonding material 59 is allowed to solidify. The fixing method can therefore be selected in accordance with how the bonding material 59 is cured.

A leakage output from the vibrating body bonded along with the IC chip 90 to the package 60 is then adjusted and suppressed as required, as shown in step S7.

The direction of leakage output vibration depends on the final shape of each of the vibrating arms that has been affected by variations in manufacturing processes. For example, when an intended cross-sectional shape of each of the vibrating arms is a rectangle, the final cross-sectional shape may be a parallelogram, a trapezoid, or a rhombus due to etching anisotropy of quartz, which is the base material. Such an undesired cross-sectional shape affects the direction of leakage output vibration.

The leakage output suppression adjustment is specifically made by irradiating and cutting part of each of the drive vibrating arms 22 with laser light. The leakage output suppression adjustment may alternatively be made by increasing or decreasing the volume of each of an adjustment electrode provided on an adjustment vibrating arm formed in advance and extending from the base 21 to change the amount of charge.

After the leakage output suppression adjustment is made, the vibration frequencies of the vibrating body bonded along with the IC chip 90 to the package 60 are precisely adjusted. Specifically, the vibration frequency fine adjustment is made as described with reference to FIG. 3B in the first embodiment.

The drive mode frequency (f1) of each of the drive vibrating arms 22 is first adjusted by increasing or decreasing a front-end-side mass (adjustment weight 31) of each of the drive vibrating arms 22, as shown in step S8. Specifically, the frequency of in-plane vibration of the drive vibrating arm 22 is adjusted by adding the adjustment weight 31 to the weight portion 24 (FIG. 1) or irradiating the adjustment weight 31 with laser light to remove part of the adjustment weight 31. In this process, it is preferable to set the range of the adjustment in consideration of an effect of the adjustment on f2.

The adjustment of the front-end-side mass of each of the drive vibrating arms 22 may alternatively be made by using any other suitable method, for example, by rewriting data in the IC chip 90.

The detection mode frequency (f2) of the drive vibrating arm 22 is then adjusted, as shown in step S9. Specifically, the detection mode frequency (f2) of the drive vibrating arm is adjusted by adding the adjustment film 30 or irradiating the adjustment film 30 with laser light or otherwise processing the adjustment film 30 to remove part thereof to change stress that the adjustment film 30 produces in the drive vibrating arm 22.

After the adjustments described above, the vibrating gyro device 1 in the form of a vibrating element is completed.

The lid 70 as a lid member made, for example, of a metal is then bonded in a seam welding process to the upper side of the package 60 via the seal ring 69 made, for example, of an iron-nickel alloy, and the package 60 in which the vibrating gyro device 1 and the IC chip 90 are accommodated is thus sealed, as shown in step S10.

As other methods for bonding the lid 70, the lid 70 may be bonded onto the package 60 with solder or any other metal wax material interposed therebetween or by forming the lid 70 with a glass material and bonding the lid 70 onto the package 60 with a low-melting glass material or any other suitable material interposed therebetween. In the sealing step described above, the cavity formed by the package 60 and the lid 70 can be sealed and encapsulated to form a reduced pressure space or an inert gas atmosphere as required.

The thus sealed package 60 is then baked in an oven at a predetermined temperature for a predetermined period. Finally, an electrical characteristic test, a visual inspection, and other characteristic-related tests are performed, and defective products that do not fall within specifications are removed. The series of gyro sensor manufacturing steps and hence the gyro sensor 50 are completed.

According to the vibrating element manufacturing method and the sensor unit manufacturing method of this embodiment, since the frequency of in-plane vibration (f1) of each of the drive vibrating arms 22 and the frequency of out-of-plane vibration (f2) of the drive vibrating arm 22 can be adjusted separately from each other, the frequencies can be efficiently adjusted to intended values. As a result, in the case of a vibrating gyro, for example, a vibrating element having high detection sensitivity can be provided.

In this embodiment, a method for manufacturing the vibrating gyro device 1 as a vibrating element and the gyro sensor 50 as a sensor unit using the vibrating gyro device 1 has been described, but the vibrating element is not limited to the vibrating gyro device 1. A sensor unit using, for example, the vibrating gyro device 2 as the vibrating element can also be provided by using the same manufacturing method.

Fifth Embodiment

Electronic Apparatus

Figure 7A:
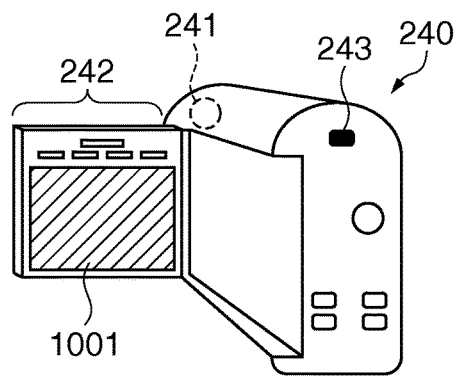
FIG. 7A is a perspective view of a digital video camcorder as an embodiment of an electronic apparatus.

FIG. 7A shows an application example in which the vibrating gyro device 1 or 2 or the gyro sensor 50 as a sensor unit including the vibrating gyro device 1 or 2 described in the above embodiments is incorporated in a digital video camcorder as an electronic apparatus. A digital video camcorder 240 includes an image receiving section 241, an operation section 242, an audio input section 243, and a display unit 1001. Further incorporating the vibrating gyro device 1 or 2 or the gyro sensor 50 as a sensor unit according to the corresponding one of the embodiments described above in the digital video camcorder 240 allows the digital video camcorder 240 to perform what is called a hand-shake correction function.

Figure 7B:
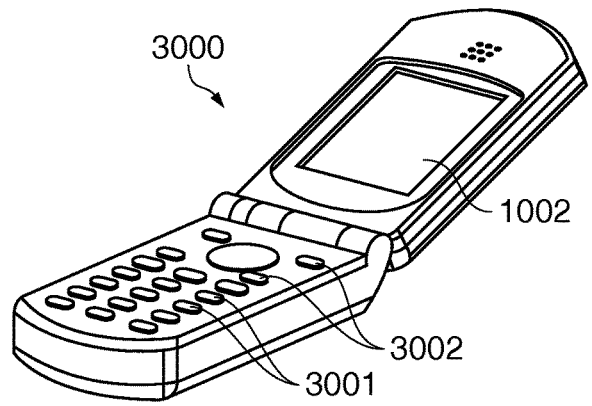
FIG. 7B is a perspective view of a mobile phone as another embodiment of an electronic apparatus.
Figure 7C:
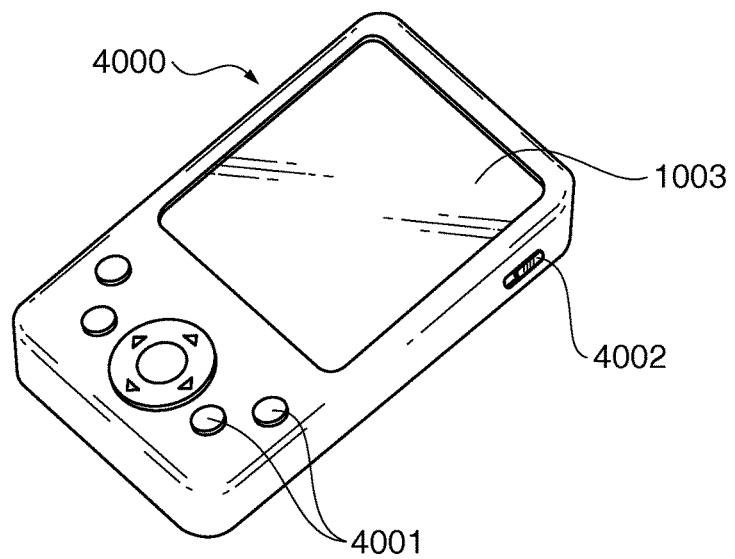
FIG. 7C is a perspective view of a personal digital assistant (PDA) as another embodiment of an electronic apparatus.

FIG. 7B shows an application example in which the vibrating gyro device 1 or 2 or the gyro sensor 50 is incorporated in a mobile phone as an electronic apparatus, and FIG. 7C shows an application example in which the vibrating gyro device 1 or 2 or the gyro sensor 50 is incorporated in a personal digital assistant (PDA) as an electronic apparatus.

First, a mobile phone 3000 shown in FIG. 7B includes a plurality of operation buttons 3001 and scroll buttons 3002 and a display unit 1002. When a user operates any of the scroll buttons 3002, a screen displayed on the display unit 1002 is scrolled.

A PDA 4000 shown in FIG. 7C includes a plurality of operation buttons 4001, a power switch 4002, and a display unit 1003. When a user operates the power switch 4002, an address book, a schedule card, and a variety of other pieces of information are displayed on the display unit 1003.

When the vibrating gyro device 1 or 2 or the gyro sensor 50 as a sensor unit according to the corresponding one of the embodiments described above is incorporated in the mobile phone 3000 and the PDA 4000, a variety of capabilities can be achieved. For example, when the mobile phone 3000 shown in FIG. 7B is provided with a camera capability (not shown), hand-shake correction can be made as in the digital video camcorder 240 described above. When the mobile phone 3000 shown in FIG. 7B or the PDA 4000 shown in FIG. 7C is provided with a widely known global positioning system (GPS), incorporating the vibrating gyro device 1 or 2 or the gyro sensor 50 as a sensor unit according to the corresponding one of the embodiments described above in the mobile phone 3000 or the PDA 4000 allows the GPS to recognize the position and attitude of the mobile phone 3000 or the PDA 4000.

An electronic apparatus that can incorporate a sensor unit including the vibrating element according to the corresponding one of embodiments of the invention (gyro sensor) is not limited to the electronic apparatus shown in FIGS. 7A to 7C and may, for example, be a mobile computer, a car navigation apparatus, an electronic notebook, a desktop calculator, a workstation, a TV phone, a POS terminal, and a game console.

Any of the electronic apparatus according to this embodiment, which includes the vibrating element efficiently adjusted to be capable of higher-sensitivity detection than in related art, can provide an electronic apparatus having stable characteristics.

The invention is not limited to the embodiments described above, and a variety of changes, improvements, and other modifications can be made to the embodiments described above. Variations will be described below. The same components as those in the embodiments described above have the same reference characters and no redundant description of the same components will be made.

Variation 1

Figure 8:
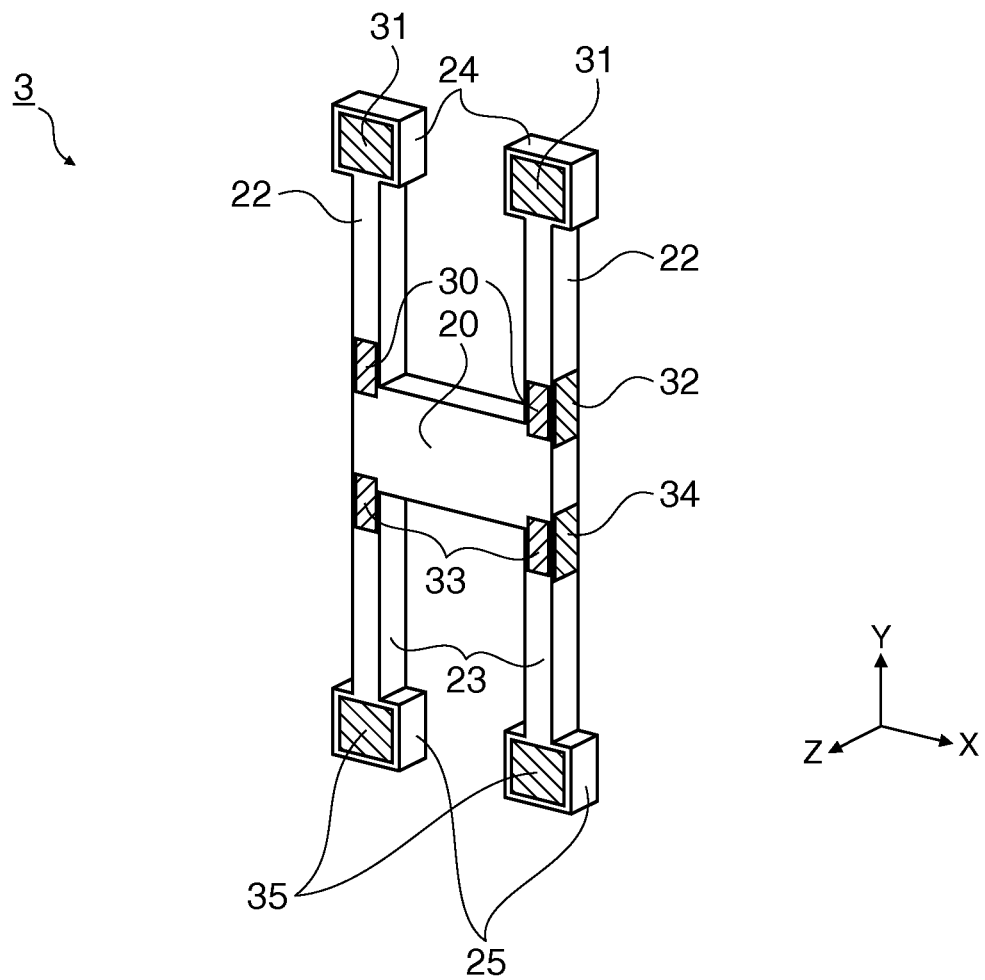
FIG. 8 is a schematic perspective view showing a vibrating gyro device in the form of a vibrating element according to Variation 1.

FIG. 8 is a schematic perspective view showing a vibrating gyro device 3 in the form of a vibrating element according to Variation 1.

The vibrating gyro device 3 is formed, for example, of a base 20, drive vibrating arms 22, detection vibrating arms 23, weight portions 24 and 25, adjustment films 30, 32, 33, and 34, and adjustment weights 31 and 35.

The base 20 has a length in the X-axis direction shorter than that of the base 21 of the vibrating gyro device 1 (FIG. 1), and the drive vibrating arms 22 and the detection vibrating arms 23 extend from the X-axis-side opposite ends of the base 20.

Each of the weight portions 25 is provided at the −Y-axis-side front end of the corresponding detection vibrating arm 23 and has a substantially rectangular shape having a width greater than that of the elongated arm (wider in X-axis direction). The adjustment weights 35, each of which is a film member similar to the adjustment weights 31, are provided on the surfaces of the respective weight portions 25.

Each of the drive vibrating arms 22, which extend from the X-axis-side opposite ends of the base 20, is provided with the adjustment film 32 on a side surface in an area close to the base 20 (base end area of drive vibrating arm 22 extending from base 20).

Each of the detection vibrating arms 23, which extend from the X-axis-side opposite ends of the base 20, is provided with the adjustment film 33 on a principal surface in an area close to the base 20 (base end area of detection vibrating arm 23 extending from base 20).

Each of the detection vibrating arms 23, which extend from the X-axis-side opposite ends of the base 20, is provided with the adjustment film 34 on a side surface in an area close to the base 20 (base end area of detection vibrating arm 23 extending from base 20).

Each of the adjustment films 32, 33, and 34 is a film member similar to the adjustment films 30.

As described above, the vibrating gyro device 3 is substantially the same as the vibrating gyro device 1 except that the detection vibrating arms 23 are also provided with the weight portions 25 and the adjustment films 32, 33, and 34 are further provided.

According to the vibrating gyro device 3 in the form of a vibrating element of this variation, the following advantageous effects can be provided in addition to those provided in the first embodiment described above.

Providing the weight portions 25 and the adjustment weights 35 also allows adjustment of the vibration frequency of the detection vibrating arms 23.

Providing the adjustment films 32 allows adjustment of the vibration frequency of the drive vibrating arms 22 over a wider range than in the first embodiment.

Providing the adjustment films 33 not only also allows adjustment of the vibration frequency of the detection vibrating arms 23 but also allows adjustment of the vibration frequencies of the drive vibrating arms 22 and the detection vibrating arms 23 over a wider range than in the first embodiment.

Providing the adjustment films 34 allows adjustment of the vibration frequency of the detection vibrating arms 23 over a wider range than in the first embodiment.

Other Variations

A variety of changes can be made to the invention to the extent that they do not depart from the substance of the invention.

For example, each of the above embodiments has been described with reference to the case where the vibrating gyro device in the form of a vibrating element is made of quarts, but the vibrating gyro device can alternatively be made of a piezoelectric material other than quartz. For example, the following materials can be used: an oxide substrate made, for example, of an aluminum nitride (AlN), a lithium niobate ($LiNbO_3$), a lithium tantalate ($LiTaO_3$), lead zirconate titanate (PZT), lithium tetraborate ($Li_2B_4O_7$), or Langasite ($La_3Ga_5SiO_{14}$); a layered piezoelectric substrate formed by layering piezoelectric materials, such as an aluminum nitride and tantalum pentoixide ($Ta_2O_5$), on a glass substrate; and a piezoelectric ceramic.

The vibrating element can alternatively be made of a material other than a piezoelectric material. For example, the vibrating element can be made of a silicon semiconductor material.

Further, how to cause a vibrating element to vibrate (how to drive vibrating element) is not limited to a piezoelectric-based driving method. A vibrating element driven based on an electrostatic drive method using an electrostatic force, a Lorentz drive method using a magnetic force, and other methods as well as a piezoelectric drive method using a piezoelectric substrate can be configured in accordance with the invention and provide advantageous effects thereof.

The entire disclosure of Japanese Patent Application No: 2012-76471, filed Mar. 29, 2012 is expressly incorporated by reference herein.

What is claimed is:

1. A vibrating element comprising:
   a base; and
   a drive vibrating arm and a detection vibrating arm extending from the base,
   wherein the drive vibrating arm has a principal surface parallel to a plane in which the drive vibrating arm vibrates with a drive signal, and
   an adjustment film is provided on the principal surface adjacent to the base, a portion of the adjustment film extending onto a portion of a principal surface of the base, and
   a weight portion is provided on an end of the drive vibrating arm opposite to the base,
   wherein an adjusted mass of the weight portion corrects the frequency of in-plane vibration of the drive vibrating arm and the frequency of out-of-plane vibration of the drive vibrating arm, and
   the adjustment film adjusts the frequency of out-of-plane vibration of the drive vibrating arm.

2. The vibrating element according to claim 1,
   wherein the drive vibrating arm extends from one end of the base, and
   the detection vibrating arm extends from the other end of the base that faces away from the one end.

3. The vibrating element according to claim 2,
   wherein a portion of the adjustment film is removed.

4. The vibrating element according to claim 1,
   wherein a portion of the adjustment film is removed.

5. The vibrating element of claim 1, wherein the drive vibrating arm includes a base side, wherein the base side of the drive vibrating arm is an area starting from a position where the drive vibrating arm is halved in an elongated direction and extending toward a base end.

6. A method for manufacturing a vibrating element, the method comprising:
   providing a vibrating body including a base and a drive vibrating arm and a detection vibrating arm extending from the base, wherein the drive vibrating arm has a principal surface parallel to a plane in which the drive vibrating arm vibrates with a drive signal;
   increasing a mass of the drive vibrating arm on a front end side thereof or decreasing the mass of the drive vibrating arm on the front end side thereof to correct the frequency of in-plane vibration of the drive vibrating arm and the frequency of out-of-plane vibration of the drive vibrating arm; and
   forming an adjustment film on the principal surface of the drive vibrating arm adjacent to the base and removing at least part of the adjustment film such that a portion of the adjustment film extends onto a portion of a principal surface of the base to adjust the frequency of out-of-plane vibration of the drive vibrating arm.

7. A sensor unit comprising:
   a base;
   a drive vibrating arm and a detection vibrating arm extending from the base, wherein the drive vibrating arm has a principal surface parallel to a plane in which the drive vibrating arm vibrates with a drive signal; and
   an electronic part including a drive circuit that causes the drive vibrating arm to vibrate and a detection circuit that detects a detection signal produced in the detection vibrating arm,
   wherein an adjustment film is provided on the principal surface of the drive vibrating arm adjacent to the base, a portion of the adjustment film extending onto a portion of a principal surface of the base,
   a weight portion is provided on an end of the drive vibrating arm opposite to the base,
   an adjusted weight of the weight portion corrects the frequency of in-plane vibration of the drive vibrating arm and the frequency of out-of-plane vibration of the drive vibrating arm, and
   the adjustment film adjusts the frequency of out-of-plane vibration of the drive vibrating arm.

8. The sensor unit of claim 7, wherein the drive vibrating arm extends from one end of the base, and the detection vibrating arm extends from the other end of the base that faces away from the one end.

9. The sensor unit of claim 8, wherein a portion of the adjustment film is removed.

10. The sensor unit of claim 7, wherein a portion of the adjustment film is removed.

11. An electronic apparatus comprising a vibrating element, wherein the vibrating element further includes:
    a base; and
    a drive vibrating arm and a detection vibrating arm extending from the base,
    wherein the drive vibrating arm has a principal surface parallel to a plane in which the drive vibrating arm vibrates with a drive signal,
    wherein an adjustment film is provided on the principal surface of the drive vibrating arm adjacent to the base, a portion of the adjustment film extending onto a portion of a principal surface of the base,
    wherein a weight portion is provided on an end of the drive vibrating arm opposite to the base,
    wherein an adjusted weight of the weight portion corrects the frequency of in-plane vibration of the drive vibrating arm and the frequency of out-of-plane vibration of the drive vibrating arm, and wherein the adjustment film adjusts the frequency of out-of-plane vibration of the drive vibrating arm.

12. The electronic apparatus of claim 11, wherein the drive vibrating arm of the vibrating element extends from one end of the base, and the detection vibrating arm extends from the other end of the base that faces away from the one end.

13. The electronic apparatus of claim 12, wherein at least part of the adjustment film is removed.

14. The electronic apparatus of claim 11, wherein at least part of the adjustment film of the vibrating element is removed.

\* \* \* \* \*